United States Patent [19]
Petric

[11] Patent Number: 4,607,167
[45] Date of Patent: * Aug. 19, 1986

[54] CHARGED PARTICLE BEAM LITHOGRAPHY MACHINE INCORPORATING LOCALIZED VACUUM ENVELOPE

[75] Inventor: Paul F. Petric, Swampscott, Mass.

[73] Assignee: Varian Associates, Inc., Palo Alto, Calif.

[*] Notice: The portion of the term of this patent subsequent to Jul. 9, 2002 has been disclaimed.

[21] Appl. No.: 701,439

[22] Filed: Feb. 12, 1985

Related U.S. Application Data

[63] Continuation of Ser. No. 435,178, Oct. 19, 1982.

[51] Int. Cl.⁴ .................. H01J 37/18; H01J 33/02
[52] U.S. Cl. ..................... 250/492.2; 250/441.1; 219/121 EN; 219/121 EQ
[58] Field of Search ........... 250/492.2, 441.1, 442.1; 219/121 EN, 121 EQ

[56] References Cited

U.S. PATENT DOCUMENTS

| | | | |
|---|---|---|---|
| 3,156,811 | 11/1964 | Barry | 219/121 EQ |
| 3,388,235 | 6/1968 | Pinsley et al. | 219/121 EQ |
| 3,426,173 | 2/1969 | Steigerwald | 219/121 |
| 3,504,371 | 3/1970 | Reeds, Jr. | 346/110 |
| 4,063,103 | 12/1977 | Sumi | 250/442.1 X |
| 4,393,295 | 7/1983 | Beisswenger et al. | 219/121 EJ |

FOREIGN PATENT DOCUMENTS

| | | |
|---|---|---|
| 2152100 | 4/1973 | Fed. Rep. of Germany . |
| 2207090 | 9/1973 | Fed. Rep. of Germany . |
| 2023336A | 12/1979 | United Kingdom . |
| 2027271A | 2/1980 | United Kingdom . |

*Primary Examiner*—Craig E. Church
*Assistant Examiner*—Jack I. Berman
*Attorney, Agent, or Firm*—Stanley Z. Cole; Norman E. Reitz; William R. McClellan

[57] ABSTRACT

A charged particle beam lithography machine includes a beam source and beam steering and forming elements within an evacuated column. A stage assembly for supporting a semiconductor wafer or mask is positioned in ambient and proximate the exit end of said beam steering and forming elements. A vacuum envelope apparatus is affixed to the exit end of the beam steering and forming elements so that the outer surface or tip of the vacuum envelope apparatus rests in spaced apart, close coupled opposition to the wafer or mask supported on the stage. The vacuum envelope apparatus includes internal structural members which define an internal vacuum processing zone and at least one surrounding intermediate vacuum zone. A graded vacuum seal is formed between the tip of the vacuum envelope and the mask or wafer. The seal extends from the internal vacuum processing zone to the external ambient. Lithographic operations are conducted on the mask or wafer as relative motion between the stage assembly and the beam steering and forming elements is accomplished.

13 Claims, 8 Drawing Figures

CHARGED PARTICLE BEAM LITHOGRAPHY MACHINE INCORPORATING LOCALIZED VACUUM ENVELOPE

GOVERNMENT RIGHTS

The Government has rights in this invention pursuant to Contract No. F19628-80-C-0173 awarded by the Department of the Air Force.

This application is a continuation of application Ser. No. 435,178, filed Oct. 19, 1982.

This invention relates to a charged particle beam lithography machine and, more particularly, relates to a charged particle beam lithography machine incorporating an envelope apparatus for localized vacuum processing.

In the development of lithography equipment in which a charged particle beam is steered to perform lithographic operations on a mask or a semiconductor wafer, the trend has been towards greater resolution, higher throughput and lower cost processing. At some point along this trend it becomes cost effective to perform lithographic operations directly onto semiconductor wafers rather than to perform lithographic operations on masks and then transfer the lithographically produced patterns onto wafers by optical means—thus the appellation direct write lithography. In order for wafers as well as masks to be prepared cost effectively, the components of the system must be fabricated as small, reliable and inexpensive units.

Electron and ion beam lithography machines require movement of the workpiece during processing. In electron beam lithography machines, for example, micron or submicron patterns of extremely high accuracy are exposed on the workpiece. To achieve high accuracy, the deflection field of the electron beam is limited to an area much smaller than the area of the workpiece. Typically, the deflection field in an electron beam system is one or a few millimeters, while the workpiece, usually a semiconductor wafer or a mask plate, can be up to several inches in extent. Thus, precise positioning of the workpiece is required. In the past, typically the workpiece has been positioned by a system of drive motors external to the vacuum region and vacuum tight bellows or rotary seals are used to seal the mechanical linkage which is used to transmit the motion of the drive means into the vacuum; alternately, the motors have been placed in vacuum tight enclosures and placed within a vacuum chamber. Such systems have been large, complex and relatively unreliable. See, for example, the hybrid raster scan system of R. J. Collier, "Electron Beam Exposure System", U.S. Pat. No. 3,900,737. In spite of the size and complexity of such positioning systems, the particle beam itself only scans over a very small localized region of the workpiece surface; large movements must be made by the wafer handling systems.

In achieving greater resolution in charged particle beam lithographic equipment the limits are not found to lie principally in the ability to precisely steer the beam or in the properties of the photoresist. Rather, they are often found to lie in the ability to present the semiconductor wafer or mask in a known, usually planar, orientation to the impinging charged particle beam. Nonplanarity of the wafer results in distortion of the lithographic pattern formed on the wafer due to variations in the depth of focus of the electron optically formed charged particle beam. Nonplanarity may also result from irregularities in the thickness of wafers as supplied by wafer manufacturers. And prior processing, e.g., etching or metallization, can produce irregular upper surfaces for the wafers. Special fixtures have been designed to overcome these problems. See, e.g., P. E. Stuckert, "Spherical Support and Translation Device for Wafers," U.S. Pat. No. 3,920,233. Variations in the orientation of the wafer due to uneven platens or to microscopic particles between the wafer and the platen may be controlled by using wafer holders that only contact limited points on the wafer. See, e.g., V. A. Firtion, "Apparatus and Method for Holding and Planarizing Thin Workpieces," U.S. Pat. No. 4,213,698. There has been no straightforward, practicable solution to these problems especially as these problems have become more severe with more highly integrated devices.

When lateral, typically rectilinear, movements of the semiconductor wafer are accomplished to make gross adjustments as the lithographic pattern is written, it is important that the motion be highly responsive and smooth. Thus, it is undesirable for significant periods of acceleration or deceleration to be experienced. Preferably, the motion should be rectilinear since the typical patterns on semiconductor wafers have this symmetry. Also, the motion should not introduce vibrations to the system, and the drive movements should preferably not need to be communicated into the vacuum region.

It is therefore an object of the present invention to provide a charge particle beam lithography machine in which the semiconductor wafer or mask need not be enclosed entirely in vacuum.

It is another object of the present invention to provide charged particle beam lithography machine which employs a vacuum envelope apparatus and a linear motor driven stage.

It is a further object of the present invention to provide a charge particle beam lithography machine in which the wafers or masks may be processed serially.

It is a still further object of the present invention to provide charged particle beam lithography machine in which the motion of the wafer supporting stage is isolated from the machine by air bearing means.

It is a yet further object of this invention to provide charged particle beam lithography machine in which the wafer or mask transport and positioning system is located entirely in an ambient environment.

It is another object of this invention to provide a machine for producing semiconductor masks which eliminates the requirement for curing negative photoresist.

BRIEF DESCRIPTION OF THE DRAWINGS

For a more complete understanding of the charged particle beam lithography machine of the present invention, reference may be had to the drawings which are incorporated herein by reference and in which.

SUMMARY OF THE INVENTION

A charged particle beam lithography machine includes a beam source and a beam steering and forming mechanism within an evacuated column. A stage for supporting a semiconductor wafer or mask is positioned in ambient and proximate the exit end of said beam steering mechanism. The vacuum envelope apparatus is connected to the end of the beam steering means so that the outer surface or tip of the vacuum envelope apparatus rests in spaced apart, close coupled opposition to the wafer or mask mounted on the stage. A graded vacuum seal is formed between the tip of the vacuum envelope and the mask or wafer. The graded vacuum seal extends between an internal beam processing zone and the ambient environment external to the envelope apparatus. The stage moves in a plane oriented orthogonal to the working beam by means of linear motors which produce smooth, rectilinear motion.

DESCRIPTION OF THE PREFERRED EMBODIMENTS

Figure 1:
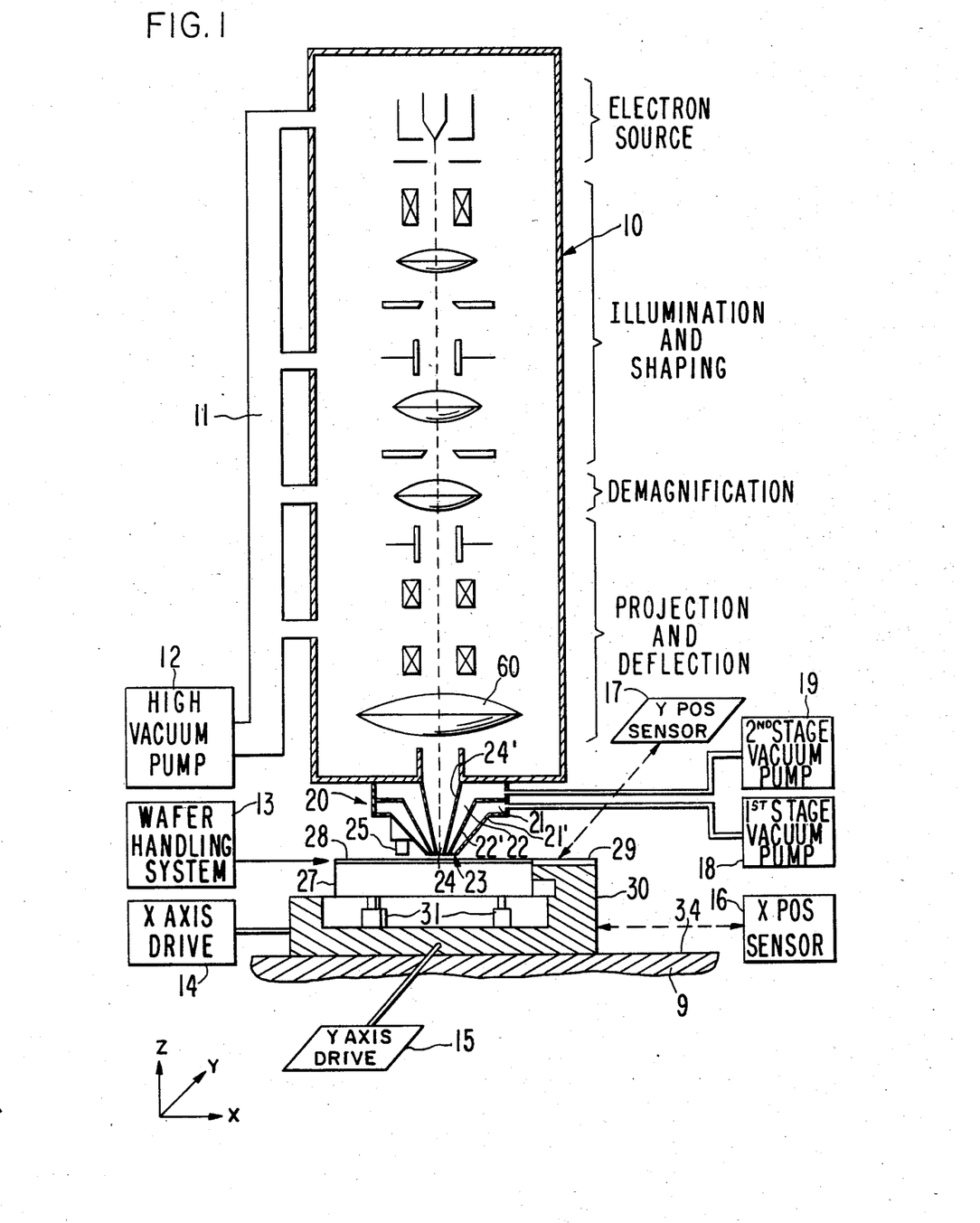
FIG. 1 is a side schematic view of a charged particle beam lithography machine of the present invention.

Charged particle beam lithographic machines typically include within contiguous vacuum regions a beam source, beam steering and forming means, a stage for the semiconductor wafer or mask, and means to move the stage with respect to the beam. For electron beam lithography the beam source is an electron beam source and the beam steering and forming elements comprise an electron optical column. For focused ion beam lithography the beam source is an ion beam source and the beam steering and forming means comprises ion deflection and focusing means. The typical prior art machine has been simplified and improved in the charged particle beam lithography machine of the present invention by the incorporation of a vacuum envelope apparatus. Such a vacuum envelope apparatus is described in detail in copending application, Ser. No. 435,179, filed on even date herewith. As shown in FIG. 1, in the context of an electron beam lithography machine, an envelope apparatus 20 is attached to the bottom of electron beam column 10. The tip 23 of envelope 20 rests slightly above the surface of semiconductor wafer 28 mounted on vacuum chuck 27. A gap is maintained between the tip 23 of cone 20 and the surface of wafer 28. Within this gap a graded vacuum seal is formed when the machine is in operation. Since vacuum envelope 20 is shown to be shaped as a truncated circular cone, a radial seal is formed. Within the vacuum envelope 20 interiorly positioned, spaced apart conical members 24', 22' and 21' establish discrete zones 24, 22 and 21, each zone being in communication with a vacuum pump. Intermediate zones 21 and 22 are in communication, respectively, with first stage pump 18 and second stage pump 19. Zone 24 is in communication with vacuum pump 12 which produces a sufficiently high vacuum to support the lithographic process. The quality of the vacuum at the tip necessarily reflects the low conductance between pump 12 and tip 23. The vacuum is graded from the level of the ambient environment to a low vacuum level produced by the first stage vacuum pump 18, to a higher vacuum level formed by second stage vacuum pump 19, to the processing vacuum level formed by high vacuum pump 12. In each case the actual vacuum delivered to tip 23 is dependent upon the vacuum conductance through intervening conduits and within the zones of conical tip 20. The conical shape provides inherently high conductance since the narrowest passage is at the tip. Due to low conductance produced by the filling of column 10 with electron optical elements only a portion of the high vacuum from vacuum pump 12 is communicated to tip 23 of vacuum envelope 20. Yet sufficient high vacuum is delivered through internal zone 24, and sufficient intermediate vacuum is delivered through zones 21 and 22 so that a graded vacuum seal is maintained as relative movement of stage assembly 30 is accomplished with respect to column 10. As a consequence, the point of processing of the working beam on the semiconductor wafer is always maintained under processing vacuum level even though that point moves over the surface of the semiconductor wafer.

Figure 4:
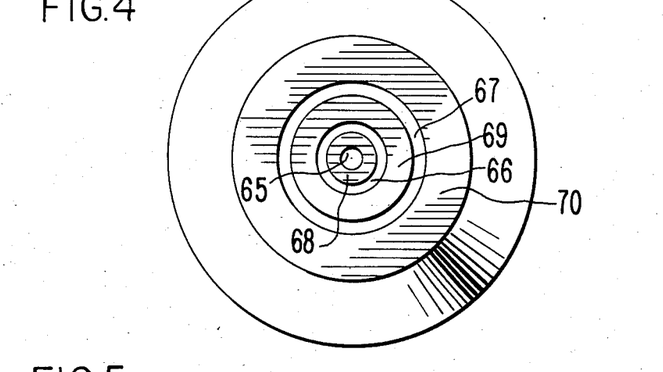
FIG. 4 is a bottom view of the tip of a vacuum envelope apparatus incorporated in the charged particle beam lithography machine of the present invention.
Figure 5:
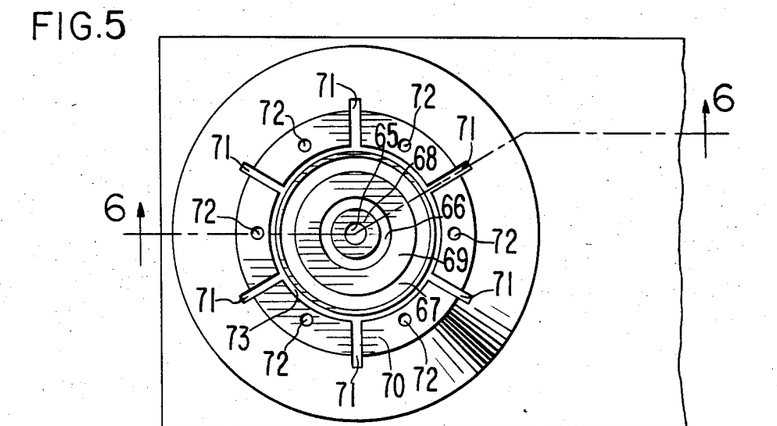
FIG. 5 is a bottom view of the tip of a vacuum envelope apparatus including an air bearing incorporated in the charged particle beam lithography machine of the present invention.
Figure 6:
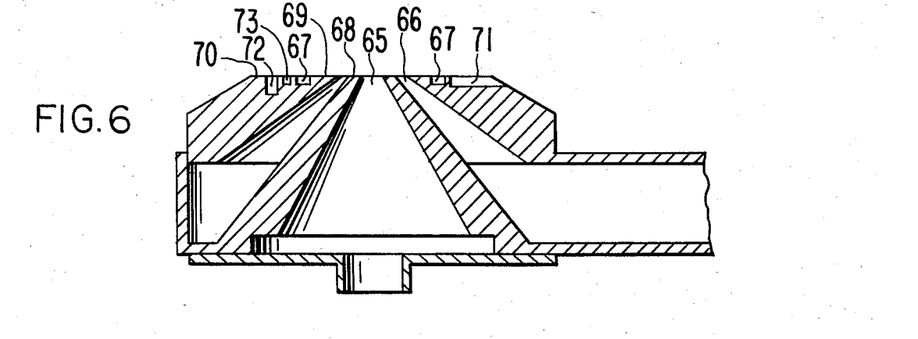
FIG. 6 is a cross-sectional view of the vacuum envelope of FIG. 5 taken through line 6—6.

The tip of an embodiment of a vacuum envelope is shown in bottom view in FIGS. 4 and 5 and in cross section in FIG. 6. The tip in FIG. 4 corresponds generally to the three-stage vacuum envelope shown in side view schematic view in FIGS. 1 and 2; the tip in FIGS. 5 and 6 corresponds generally with the three-stage envelope plus air bearing shown in side view schematic in FIGS. 7 and 8. For the three-stage vacuum envelope, high vacuum zone 65 is surrounded by conical member 68 (corresponding to 24') and connected to vacuum pump 12; intermediate vacuum zone 66 is surrounded by annular conical member 69 (corresponding to 22') and connected to second state vacuum pump 19; and intermediate vacuum zone 67 is surrounded by external conical member 70 (corresponding to 21') and connected to first stage vacuum 94. For the three-stage envelope plus air bearing, shown particularly in FIGS. 7 and 8, the same structure exists with the addition of air supply holes 72, annular groove 73 and radial air grooves 71. Air supply holes 72 are connected via zones 96 to positive air supply 89. In operation, air is supplied at an appropriate pressure to produce an air bearing between surface 70 of the tip 105 of the vacuum envelope 87 and the surface of semiconductor wafer 99. In order to minimize the flow of air into outermost intermediate vacuum zone 67, annular groove 73 is configured outside in spaced apart annular relationship. Annular groove 73 is connected to radial air grooves 71 which extend radially outward to provide a low resistance path for air flow. A small amount of air may enter vacuum zone 67. And some air does reach ambient across the circumference of surface region 70, but most air flows through annular groove 73 and radial air grooves 71 to ambient.

At all times the gap between the tip 23 of vacuum envelope 20 and semiconductor wafer 28 must be kept small enough to maintain the graded vacuum seal. For extremely flat semiconductor wafers such as those meeting the specifications of SEMI Standard M1.1 for Polished Monocrystalline Slices, the wafer holding stage 30 and vacuum chuck 27 may be held in fixed vertical (z-axis) position with respect to the wafer. The gap may then be readily maintained within the acceptable 20–40 micrometer range. The upper end of this range is limited by the gas inflow that can be tolerated while yet maintaining a vacuum level in the internal processing zone which is acceptable for charged particle beam lithography. The lower end of the range is determined by the safety margin required to ensure that no contact is made with the wafer since such contact must be avoided in order to avoid damage to the wafer or the generation of particulates.

Most usually, techniques are required to provide Z-axis movement between the wafer holding stage 30, vacuum chuck 27, and actuators 31 and the vacuum envelope 20 to maintain the gap within acceptable limits as the topography of the wafer or mask is traversed. Such active tracking permits the gap range to be maintained even if an irregular topography is encountered. Such techniques include the use of a planar air bearing which makes inherent adjustments as the gap opens or closes, the use of capacitive sensor 25 and a gap control circuit 35 or the use of air micrometers of the type set out in M. Knobel, "Work Dimensions and Position Detecting, Indicating and Controlling Method and Apparatus", U.S. Pat. No. 3,194,055. Further novel gap maintenance systems for use with an envelope apparatus of the type of the present invention are described in copending application "Gap Control System for Localized Vacuum Processing", Ser No. 435,177 filed on even date herewith and assigned to the assignee of this application. Briefly, such a gap maintenance system could comprise sensing means operative to provide a gap sense signal corresponding to the measured gap between the vacuum envelope and the article being processed. A control means is operative in response to the gap sense signal to provide a control signal corresponding to the difference between the measured gap and a desired gap dimension or range of allowed dimensions. An actuating means is operative to vary the gap between the vacuum envelope and the article in response to the control signal. In a preferred embodiment, the actuating means includes three independently controlled actuators 31 coupled through a vacuum chuck to semiconductor wafer 28, and the control means provides independent actuator signals to each of the actuators. The actuating means is thereby operative when the independent actuators are actuated by unequal amounts to vary the angle between the surface of the semiconductor wafer 28 being treated and the tip 23 of vacuum envelope 20. The surface of semiconductor wafer or mask 28 is thereby presented to the working beam with planar orientation perpendicular to the beam axis.

The movement of the stage is an important aspect of operation of a charged particle beam lithography machine. The stage must be accurately coupled to the mask or wafer so that motion of the stage is synonomous with motion of the mask or wafer. The stage must possess independent X-Y translation means which are highly responsive to drive signals, have appreciable acceleration and deceleration and do not introduce significant vibration to the stage. In the past orthogonally positioned, cylindrical air bearings coupled to servomotors with a ball screw mechanism have been employed. See D. R. Herriott, et.al., "EBES: A Practical Electron Lithography System", IEEE Transactions on Electron Devices, ED-22, p. 385 (1975). Planar air bearings have also been proposed. See W. L. Fox, "Vacuum-Sealed Gas-Bearing Assembly", U.S. Pat. No. 4,191,385. And a double sided planar air bearing may be utilized. See B. G. Lewis, et.al., "A Laser Interferometer Controlled X, Y Air Bearing for Direct Wafer Exposure Electron Beam Lithography", Proceedings 10th International Conference on Electron and Ion Beam Science and Technology, p. 477 (1982). Such air bearing type translation means have been bulky, costly, and often difficult to maintain in good running order. Also, they have had to be machined to a very high degree of precision and yet are subject to undesirable vibration.

The charged particle beam lithography machine of the present invention in one embodiment employs x-y translation means for the moving stage which has highly planar and smooth characteristics. These characteristics are provided by linear motors which prove to be ideal for a wafer stage positioning system because they have the required planar configuration and do not require two orthogonal axes of linear motion to be stacked to form the desired planar motion. When linear motors drive a stage which rides on a simple planar air bearing, stage motion is frictionless so that no particles are generated to cause defects on the substrate. This embodiment of the x-y translation means is made possible by the use of vacuum envelope apparatus of the present invention. There are many types of linear motors. See, e.g., Nasar and Boldea, *Linear Motion Electric Machines* (1976). The layout of semiconductor devices is planar and rectilinear so that the motion of linear motors is especially suited for positioning wafer holding stages to permit lithography of such devices. The preferred types for driving the moving stage of the charged particle beam lithography machine of the present invention are reluctance and inductance linear motors.

Exemplary of linear reluctance motors is the Sawyer-principle device. A moveable stage possesses a network of magnet poles which are wire-wound and function as electromagnets. A baseplate or platen has a matching or complementary network of poles. By appropriate switching of the polarity of the electromagnets embedded in the underside of the moving stage, the switched poles are selectively attracted from counterpart poles on the baseplate. The lateral components of these attractive forces produce horizontal movement of the stage while the vertical component is in dynamic equilibrium with the upward forces of the air bearing. The sense of the switching determines the direction and the timing of the switching determines the speed of the motor. Extremely smooth movement is experienced. See. e.g., B. A. Sawyer, "Magnetic Positioning Device", U.S. Pat. No. Re. 27,289; J. Dunfield, et.al., "Sawyer-Principle Linear Motor Positions Without Feedback", *Power Transmission Design*, p. 72, June 1974. A moving stage and platen assembly which incorporates such a linear reluctance motor is shown in FIG. 3 as the means for moving the wafer holding stage 30 of FIGS. 1 and 2. Flat surface 34 of platen 9 has a network 45 of low reluctance magnetic elements (shown in part) embedded therein over the whole portion of the surface thereof on which moving stage 30 travels. These magnetic elements may be fabricated by etching low reluctance iron or iron nickel alloys with the magnetic elements constituting high points in the pattern. The etched spaces between the magnetic elements are then filled with a nonmagnetic substance thereby forming a planar surface. Linear reluctance motors 15 possess an array of electromagnets on their underside which may be selectively energized to propel wafer stage assembly 30 in the y-direction; linear reluctance motors 14 also possess an array which may be energized to propel wafer stage 30 in the x-direction. Two motors are shown for each direction, one on either side of the center of mass, to ensure that no rotational forces are imparted; alternately, a single motor mounted in line with the center of mass may be used. The use of two motors, one on either side of the center of mass, further permits rotational corrections to be applied when rotational errors are detected by means of a third laser axis or other means. These linear reluctance motors are a planar analog of stepping motors of the type disclosed in H. R. Newell, "Apparatus for Dividing the Step Angle of a Stepping Motor," U.S. Pat. No. 4,297,625. As with conventional stepping motors, they may be operated in a full step mode or in a micro-step mode where only small portions of a step are taken at a time. Preferably, the stage assembly 30 rides on an air cushion supplied by air forced through conventional air bearing grooves (not shown) in the underside of wafer stage assembly 30.

As an alternative to the linear reluctance motors described above, linear inductance motors may be used. Such a motor can be coupled with a laser interferometry system embodying system controller 39 and x,y position sensors 16,17 (see M. Sumi, "Electron Beam Exposure Apparatus", U.S. Pat. No. 4,063,103) for determining instantaneous velocity and position of the stage assembly. When combined with a third position sensor (not shown), a servo controlled positioning system is formed which controls x or y position and rotation. The primary of the motor comprises a number of excitation windings positioned in a line and connected with relative phase shifts between each successive coil. The primary is incorporated in the underside of the moving stage. It produces a magnetic field which has the effect of travelling in a wave fashion along the length of the poles of the coils when a suitable excitation current is applied. The coils are wound on magnetically low reluctance cores to provide the magnetic poles as well as to make efficient use of the magnetic field. This also serves to shield or contain the field so as to reduce any adverse impact it might have on the charged particle beam. The cores can have two basic configurations. The first produces a flux direction parallel to the direction of motion and is known as a longitudinal flux linear induction motor or LFLIM. The second type is the transverse flux linear induction motor or TFLIM. In this case the magnetic flux is transverse to the direction of the motion. The secondary of the LIM is incorporated in the platen. For lithography, planar motion as well as linear motion, is required of the positioner. For this reason, the secondary or platen must be isotropic in the plane of motion, e.g., motion must be allowed to occur in all directions within the plane. The platen 9 may be made by bonding a thin sheet of copper to a plate of soft steel or iron. The copper surface is then ground to form a flat surface. The primary of the LIM is then attached to the positioner. A single LIM may be used for each direction of travel. However, to provide for rotational corrections, it is prefered to use pairs of LIMS on either side of the center of mass. In either case, a small gap is formed between the primary cores and the surface of platen 9 using bearing means such as a simple, conventional planar air bearing. Two motors are used to drive in each of two orthogonal axes. This assures the drive force is applied to the center of mass to reduce any errors for rotations or excited resonance. This also allows any rotation error measured by the laser system to be finely adjusted by driving the two motors of a single direction differentially, thus forming a rotational axis servo system.

Figure 2:
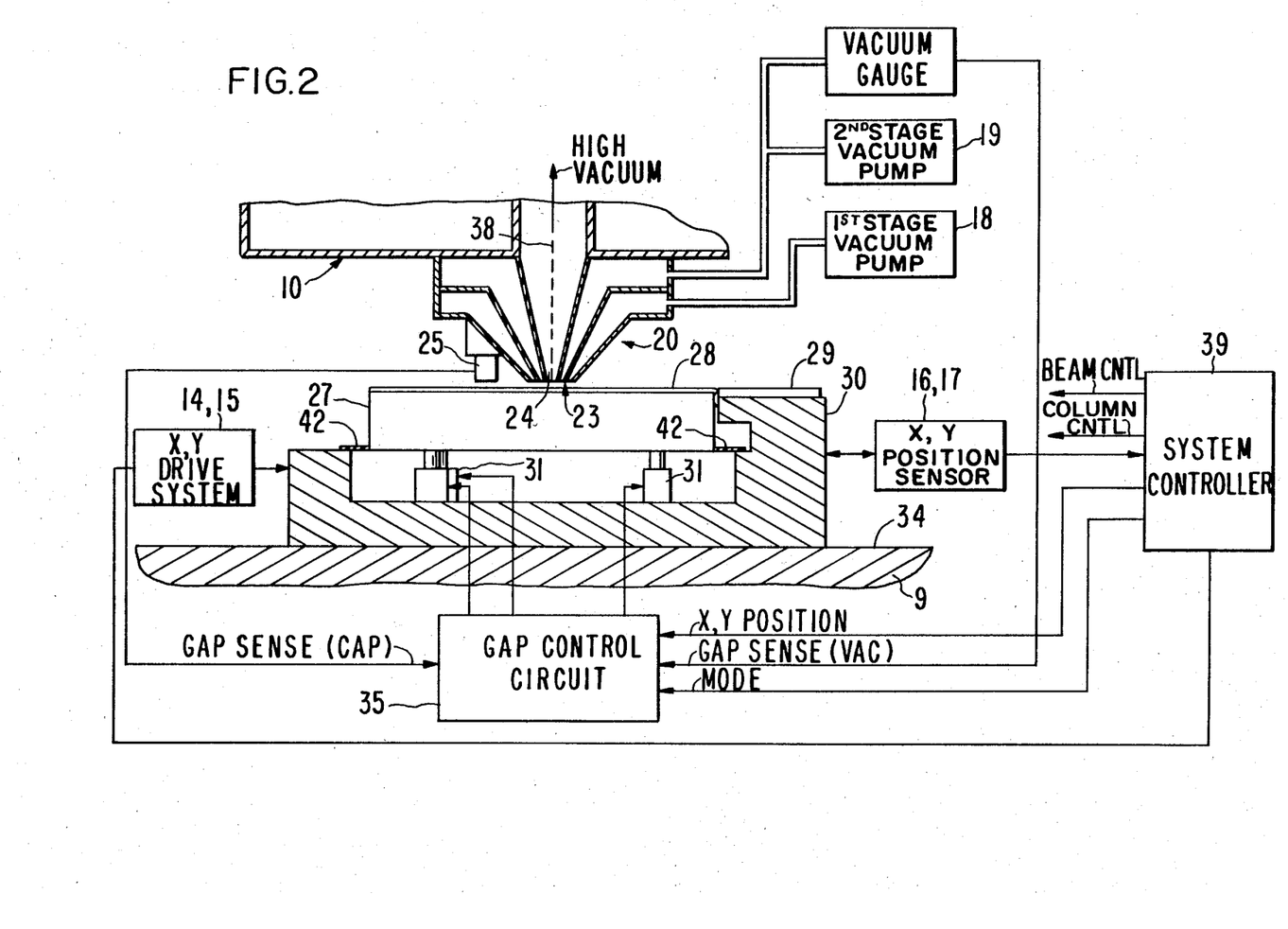
FIG. 2 is a detailed cross sectional view of the vacuum envelope and substrate handling system of the charged particle beam lithography machines of FIG. 1.
Figure 3:
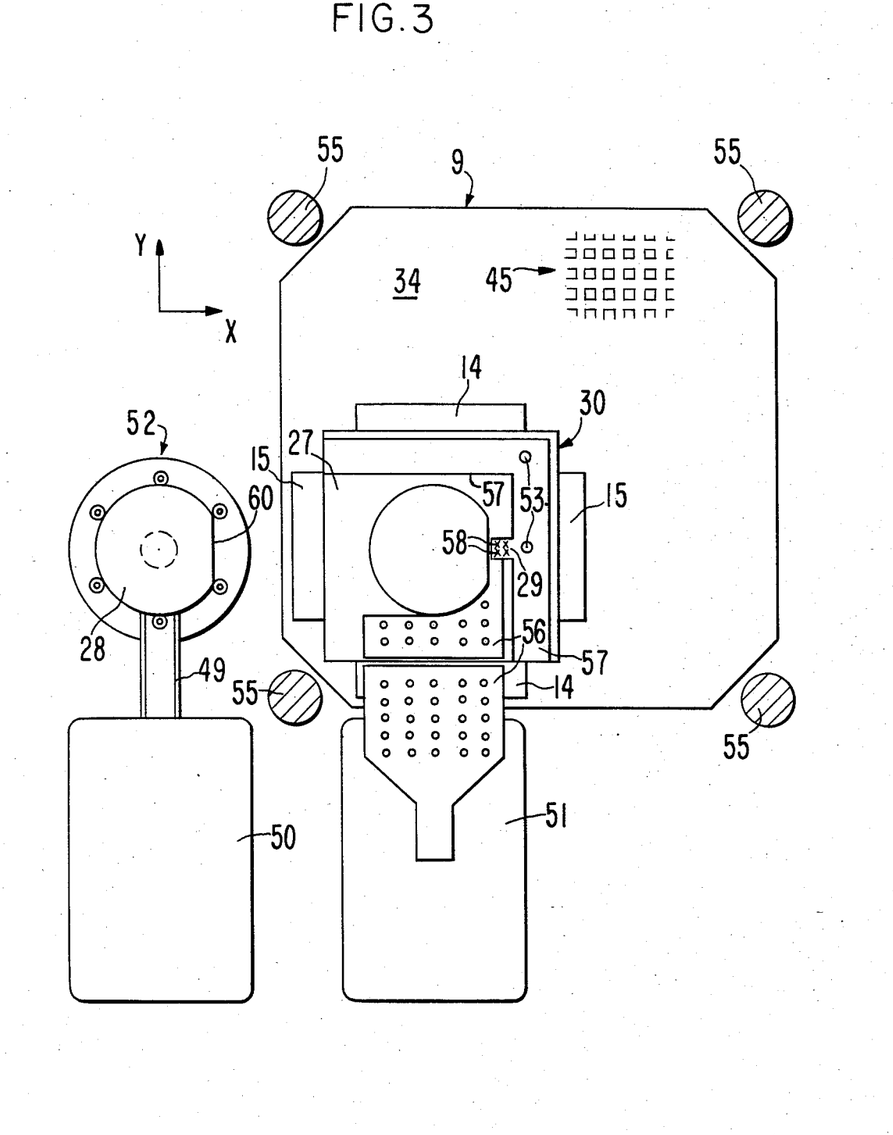
FIG. 3 is a plan view of the charged particle beam lithography machine of FIG. 1 illustrating the linear motors which drive the wafer supporting stage.

The mechanical details of a wafer handling system 13 for use with the charged particle beam lithography machine of the present invention are shown in FIGS. 2 and 3. Beam steering and forming elements are housed in the vacuum enclosure supported on posts 55 above wafer handling system 13. Wafer stage assembly 30 moves on fixed surface 34 of platen 9 by simple, conventional air bearing means (not shown). The air bearing is produced by air that flows through a network of supply holes and grooves formed in the underside of the stage assembly. Linear motors 14, 15 drive wafer stage assembly 30 in x and y directions. The control of reluctance motors 14, 15 is provided by system controller 39 which receives from x, y postion sensors 16, 17 an indication of the instantaneous position of wafer stage assembly 30. The gap dimension is controlled by gap control circuit 35 which provides an actuation signal for actuators 31 to adjust the Z-axis position of vacuum chuck 27. Vacuum chuck 27 is allowed to move vertically, but not laterally, by resilient ring 42 which connects vacuum chuck 27 with the body of wafer stage assembly 30. Resilient ring 42 may be formed, for example, of a thin metal washer which flexes vertically, but is rigid radially. Wafers are held on vacuum chuck 27 by conventional vacuum chuck means (not shown) e.g., of the type disclosed in S. Thompson, "Vacuum Chuck", U.S. Pat. No. 3,627,338 and E. Katzke, "Apparatus for Polishing Wafers", U.S. Pat. No. 3,747,282.

Figure 7:
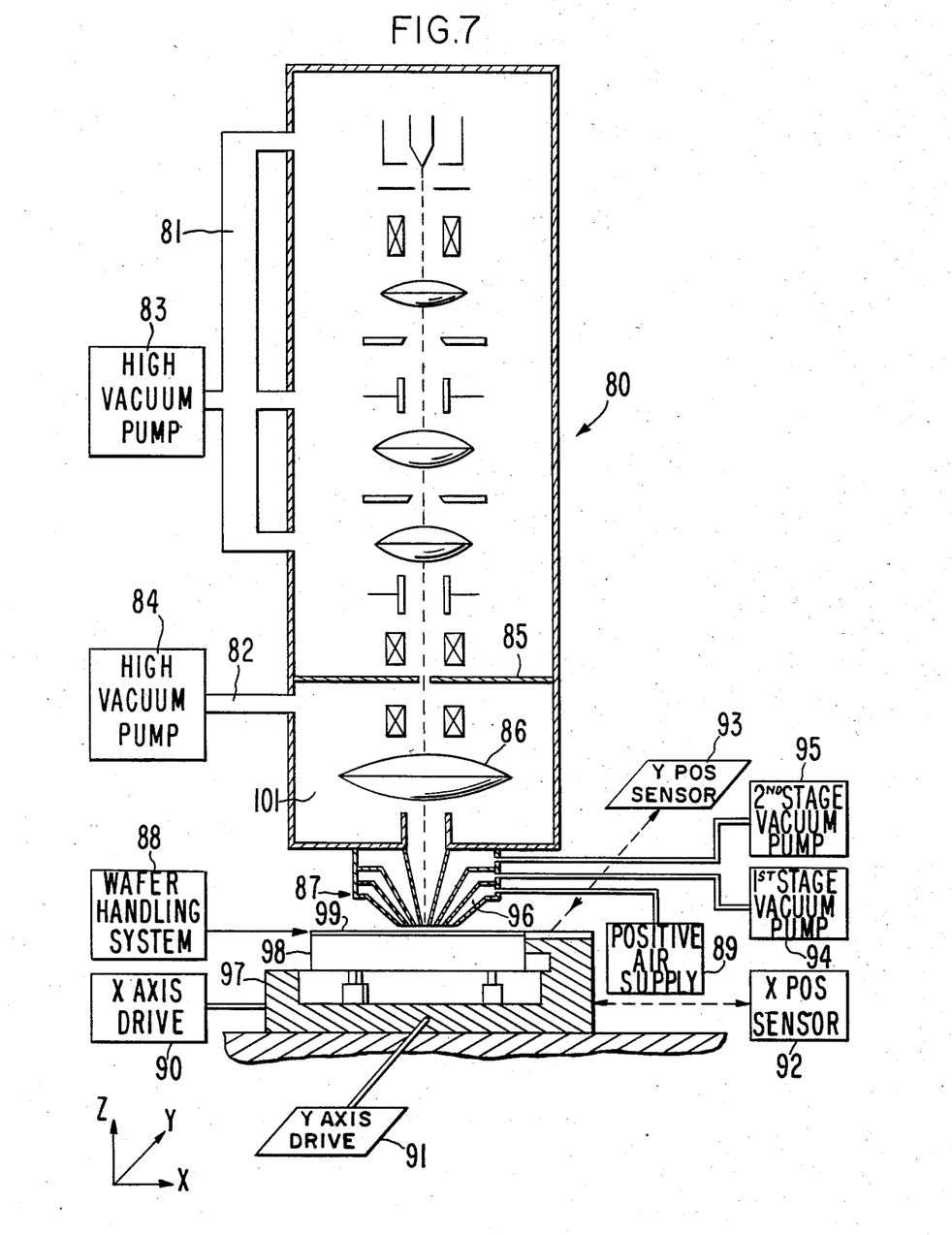
FIG. 7 is a side schematic view of an alternate embodiment of the charged particle beam lithography machine of the present invention.

Wafers are presented serially from cassette 50 via belt 49 to wafer orienter 52; or an air track may be employed. A given wafer is rotated until the flot 60 is oriented in the desired direction, shown to be parallel to the y-direction; the wafer is also centered on the orienter. The wafer is then lifted by a wafer pick (not shown) and transported over and onto vacuum chuck 27 adjacent alignment pad 29; preferably, the pick nudges the wafer into place so that flat 60 abuts alignment pad 29. This near abutment brings the flat 60 of the wafer 28 close enough to make an adequate seal for the vacuum envelope apparatus when the apparatus crosses from alignment pad 29 to the wafer 28. Actual abutment does not occur, however, to prevent possible chipping or other damage to the wafer and also to prevent the generation of particulates. Vacuum envelope 20 is able to retain vacuum in its various zones while in position over alignment pad 29 since the surface is at the same level as the surface of wafer 28. The graded vacuum seal is maintained as the vacuum envelope slides off its close coupled opposition to the surface of the wafer and into close coupled opposition to the alignment pad. The alignment pad is contiguous with region 57 so that vacuum envelope 20 may travel over a wide area and yet retain vacuum. Meanwhile, the wafer pick may place a wafer onto vacuum chuck 27 or wafers may be off-loaded. Fiducial marks 58 etched on the alignment pad are preferred for determining location and beam alignment since there is no appreciable loss of vacuum. Alternately, the Faraday cups 53 may be used for beam alignment, but degradation of the vacuum in the internal processing zone and in the column must be tolerated. The intensity of beam 38 may also be determined by moving the beam over Faraday cups 53. Wafers are off-loaded by reversing the gas flow in the vacuum chuck 27 which holds the wafer flat. As the wafer is pushed off the vacuum chuck, it is picked up by air track 56 which slides it into a receiving slot in waiting cassette 51. Such imprecise off-loading is allowed because lithographic processing has already been completed. Further, it is evident that most of the wafer is in an ambient environment. Only a small portion of the surface is exposed to the charged particle beam at any time. This eliminates the requirement for post exposure curing of negative electron resists because every portion of the resist coated wafer surfaces experiences the same amount of time in a vacuum environment. Finally, the exposed surface area is kept clean by using positive flow of a clean gas for preventing atmospheric air and contaminants therein from entering the vacuum in the gap and the envelope. As shown in FIG. 7, a positive air supply 89 provides clean gas through an annular zone 96 which surrounds the vacuum in the gap.

The use of linear reluctance or inductance motors requires the generation of magnetic fields in the vicinity of the working charge particle beam 38 as shown particularly in FIG. 1. The final focusing lens 60 in electron-optical column 10 must be close to the workpiece. Therefore, the field generated by this lens will leak out from the end of the lens. If there are external fields or magnetic materials present due, for example, to the linear motors, the field generated by this lens will interact with them thereby producing aberrations and distortions in the pattern written by the beam since the operation of the final lens has been affected. Also, as the stage moves, it moves primarily through the lens leakage field thereby creating eddy currents. These eddy currents could also interfere with the instantaneous positioning of the beam by affecing the final lens field. Consequently, in a preferred embodiment of the present invention, the internal conical surface member 24' of vacuum envelope 20 which surrounds the internal high vacuum processing zone 24 is fabricated from a ferromagnetic material in order to shield the working beam. Most preferably, all structural members that make up the other annular portions vacuum envelope 20 are also fabricated from a ferromagnetic material. This ferromagnetic material should be of fhigh permeability to maximize its effectiveness as a magnetic shield.

Figure 8:
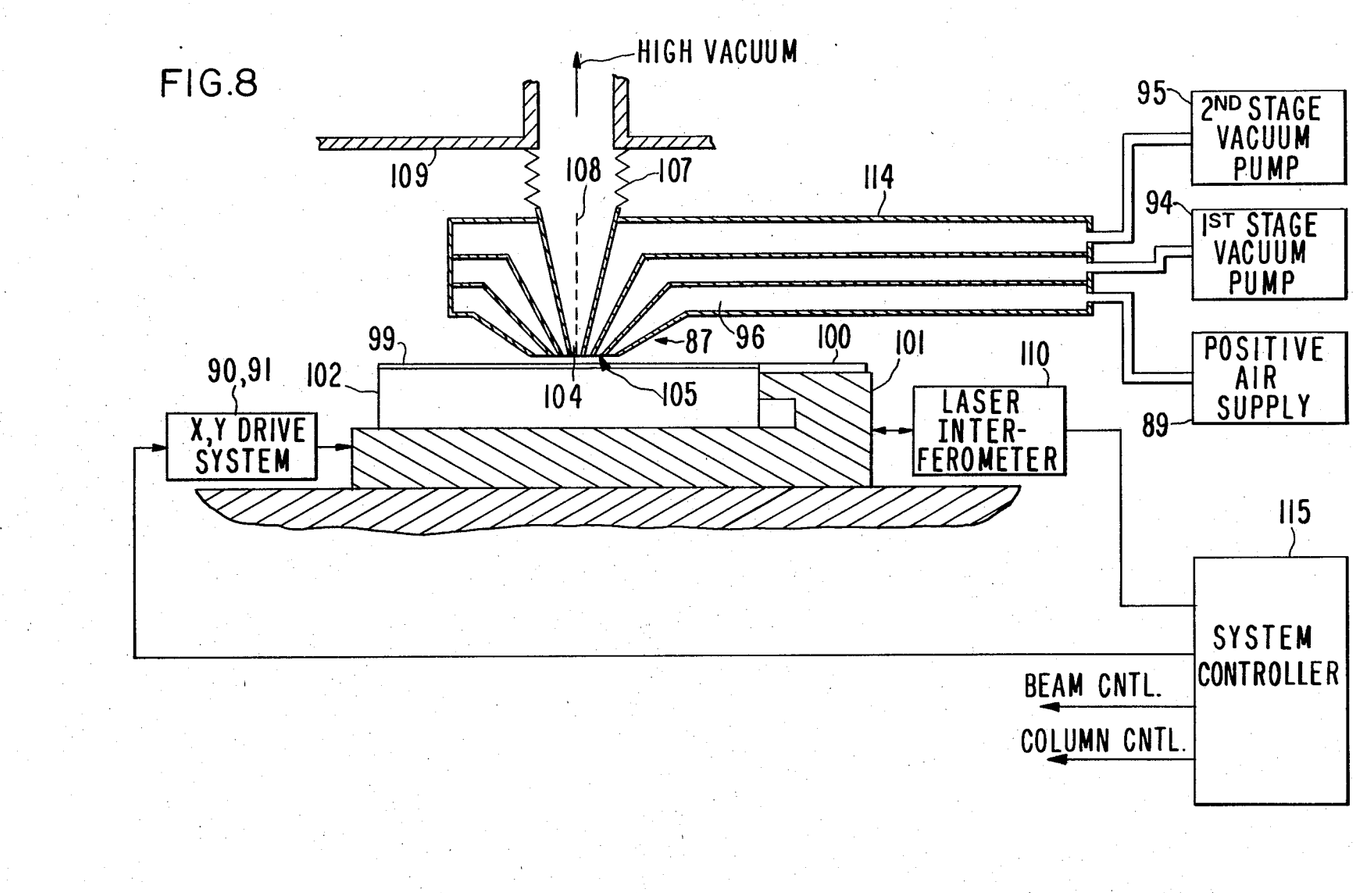
FIG. 8 is a detailed side schematic view of a variation of the alternate embodiment of FIG. 7 in which the vacuum envelope is attached to the column by a bellows.

In an alternative embodiment of the charged particle beam lithography machine of the present invention, shown in FIGS. 7 and 8, an air bearing is added to vacuum envelope 87. Positive air supply 89 provides a supply of air under pressure through outer annular zone 96. The interior zones of vacuum envelope 87 are structured as shown and described with respect to FIGS. 1 and 2. In the embodiment of FIG. 8 the gap between the tip 105 of vacuum envelope 87 and the surface of the mask or wafer 99 is maintained within an acceptable range by the dynamic equilibrium achieved between the outward forces exerted by the bas compressed in the bearing and the spring force of bellows 107. With the use of bellows 107, there is no need for actuator elements as disclosed with other embodiments. Adjustments of air flow rates and the stiffness of bellows 107 will assure an equilibrium condition which achieves the proper range for the gap. The graded seal is maintained between ambient, the vacuum level from first stage pump 94, the vacuum level from second stage pump 95 and the high vacuum from pump 84 communicates through channel 82 and column region 101. In this embodiment a separate pump 84 is used to produce high vacuum in the tip in order to overcome the high conductance experienced in the vacuum column due to the presence of electron-optical elements such as lens 86. Aperture plate 85 separates the upper region of column 80 from the lower region. Vacuum in the upper region is produced by high vacuum pump 83 and communicated through manifold 81. This dual pumping arrangement provides in effect an additional stage of vacuum pumping which can be used if the charged particle beam travels a very long path or if the sorce characteristics require higher vacuum conditions. A vacuum valve arrangement (not shown) may also be provided at aperture plate 85 to separate the two vacuum regions during service or at any other time that the beam is off. The wafer handling system 88 including stage assembly 97, x,y position sensors 92,93 and x,y axis drive means 90,91 functions substantially as described above with reference to FIGS. 2 and 3.

We claim:

1. Charged particle beam lithography apparatus for treating a semiconductor wafer or a mask workpiece surface comprising a vacuum envelope having an aperture, a charge particle beam source located in the vacuum envelope for deriving a charged particle beam that is directed through the aperture as a treating beam for the workpiece surface, means for deflecting the charged particle beam while it is in the envelope, means for maintaining only a portion of the workpiece surface in approximate registration with the aperture in a vacuum such that the beam can propagate from the source to the workpiece surface portion exclusively in a vacuum, said maintaining means including: (a) means for holding the workpiece so that all of the workpiece except said workpiece surface portion is in an ambient environment not subject to the vacuum; (b) means for preventing contact between the envelope and the workpiece so that a gap is formed between the workpiece surface and the envelope whereby the workpiece surface can move generally transversely of the beam propagation direction to enable portions of the workpiece surface to be treated in vacuo by the beam at differing times, and (c) vacuum pump means foring a graded vacuum seal in the gap generally transversely of the beam propagation direction for minimizing degradation of the vacuum through the gap; means for controlling the length of the gap to a predetermined range without contacting the workpiece; and means for providing a curtain of clean gas at approximately atmospheric pressure completely surrounding the vacuum in the gap for substantially preventing atmospheric air and contaminants therein from entering the vacuum in the gap and envelope, the envelope including a tip having a central passage defining the aperture and a concentric passage connected to the vacuum pump means for forming the graded vacuum seal, the tip terminating in a plane forming one side of the gap, the passages terminating at said plane, at least one of the passages having a cross-sectional area that increases as the distance of said one passage increases from said plane.

2. The apparatus of claim 1 wherein the holding means includes a stage assembly positioned adjacent the aperture, further including alignment pad means positioned on said assembly so it is coplanar with the surface of said workpiece and adjacent said workpiece means for moving said stage assembly so that during loading and off-loading of workpieces the assembly is in such a position that said vacuum envelope rests in spaced apart, closely coupled opposition over said pad thereby retaining the vacuum in said vacuum envelope during loading and off-loading.

3. The apparatus of claim 2 wherein said alignment pad includes fiducial marks to permit proper registration between an axis of said beam and said stage assembly.

4. The apparatus of claim 3 wherein said stage assembly includes an upper surface having a well so that the upper surface of the workpiece is coplanar with the surface of said stage whereby said surface of said stage functions as said alignment pad means.

5. The apparatus of claim 1 wherein said holding means includes a stage assembly positioned adjacent the aperture, said stage assembly including vacuum chuck means for holding said workpiece during lithographic processing.

6. The apparatus of claim 1 wherein the workpiece is flexible so that it has a tendency to bow in response to a differential pressure commensurate with the pressure across the vacuum seal subsisting between a substantial area of the treating surface and an opposed surface of the workpiece, the aperture area being sufficiently small as to minimize the bowing tendency.

7. The apparatus of claim 1 further including alignment pad means having a surface located adjacent and coplanar with the workpiece surface, said alignment pad means being positioned relative to the tip so as to maintain vacuum in said vacuum envelope during exchange of workpieces.

8. The apparatus of claim 1 wherein the tip has a frusto-conical exterior side wall extending toward the workpiece away from the remainder of the envelope and toward the beam axis.

9. The apparatus of claim 8 wherein the aperture and passage have frusto-conical side walls, in cross-section, parallel to the exterior wall cross-section.

10. A method for charged particle beam lithography treatment of a semiconductor wafer surface comprising the step of:
directing a beam from a source located in a vacuum envelope through an aperture in a vacuum tip of the envelope onto a first portion of the wafer surface that is approximately in registration with the aperture;
maintaining a gap between the vacuum tip and the first portion of the wafer surface sufficient to prevent any contact between the wafer surface and the vacuum tip;
maintaining the first portion of the wafer surface in vacuum while maintaining the remainder of the wafer surface in an ambient environment outside of the vacuum, the vacuum being formed by using vacuum pump means to form a graded vacuum seal in the gap while the first portion of the wafer surface is being treated by the charged particle beam, providing high vacuum conductance between the vacuum pump means and the vacuum tip through passage which increase in cross-sectional area as the distance from the tip increases, and maintaining the area of the aperture and the first portion of the wafer surface maintained in vacuum sufficiently small relative to the wafer surface area to permit treatment close to the edge of the wafer surface without loss of the vacuum in the gap and to minimize wafer bowing caused by the differential pressure across the wafer;
moving the wafer surface relative to the aperture so that different portions of the surface are successively in registration with the aperture while (a) maintaining the gap between the wafer surface and the aperture (b) maintaining said relationship between aperture area and the wafer surface area and without (c) breaking the vacuum seal between the workpiece surface and the vacuum envelope interior so as to treat selected portions of the wafer surface; and
substantially preventing atmospheric air and contaminants therein from entering the vacuum in the gap and the envelope by providing a curtain of clean gas at approximately atmospheric pressure completely surrounding the vacuum in the gap between the wafer surface and the vacuum envelope interior.

11. The method as defined in claim 10 including the step of holding the wafer in position for treatment by application of a vacuum to the surface opposite that being treated.

12. The method as defined in claim 10 including the steps of positioning the vacuum tip over an alignment pad coplanar with the wafer surface after completion of treatement so as to prevent loss of vacuum in the envelope, and exchanging wafers while the vacuum tip is positioned over the alignment pad.

13. The method as defined in claim 12 including the steps of controlling the length of the gap within a predetermined range.

* * * * *